(12) United States Patent
Choi et al.

(10) Patent No.: US 9,966,501 B2
(45) Date of Patent: May 8, 2018

(54) LIGHT EMITTING DEVICE WITH HIGH EFFICIENCY

(71) Applicant: Seoul Viosys Co., Ltd., Ansan-si (KR)

(72) Inventors: Seung Kyu Choi, Ansan-si (KR); Hee Sub Lee, Ansan-si (KR); Soon Ho Ahn, Ansan-si (KR); Chae Hon Kim, Ansan-si (KR); Su Youn Hong, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days. days.

(21) Appl. No.: 15/255,711

(22) Filed: Sep. 2, 2016

(65) Prior Publication Data

US 2017/0069790 A1 Mar. 9, 2017

(30) Foreign Application Priority Data

Sep. 7, 2015 (KR) .................. 10-2015-0126400
Sep. 7, 2015 (KR) .................. 10-2015-0126407
Aug. 11, 2016 (KR) .................. 10-2016-0102331

(51) Int. Cl.
| | |
|---|---|
| *H01L 33/04* | (2010.01) |
| *H01L 33/14* | (2010.01) |
| *H01L 33/16* | (2010.01) |
| *H01L 33/32* | (2010.01) |
| *H01L 33/06* | (2010.01) |

(52) U.S. Cl.
CPC ............. *H01L 33/16* (2013.01); *H01L 33/32* (2013.01); *H01L 33/06* (2013.01); *H01L 33/145* (2013.01)

(58) Field of Classification Search
CPC .......... H01L 33/14; H01L 33/04; H01L 33/16
USPC ...................... 257/66, 94, 101, 103; 438/478
See application file for complete search history.

(56) References Cited

U.S. PATENT DOCUMENTS

| | | | | |
|---|---|---|---|---|
| 6,696,177 B1* | 2/2004 | Hatwar | .................. | C09K 11/06 257/88 |
| 2006/0192195 A1* | 8/2006 | Lee | ......................... | B82Y 20/00 257/14 |
| 2008/0111480 A1* | 5/2008 | Lee | ..................... | H01L 51/5048 313/504 |
| 2008/0179623 A1* | 7/2008 | Tachibana | ............... | H01L 33/02 257/103 |
| 2009/0020780 A1* | 1/2009 | Lee | ......................... | H01L 33/14 257/101 |
| 2009/0206741 A1* | 8/2009 | Yoon | ...................... | B82Y 10/00 313/504 |
| 2009/0267091 A1* | 10/2009 | Kinoshita | ............... | H01L 33/12 257/94 |
| 2009/0298265 A1* | 12/2009 | Fujiwara | ................... | C30B 9/04 438/478 |
| 2012/0049156 A1* | 3/2012 | Ohta | .................... | H01L 21/0237 257/13 |
| 2015/0263228 A1* | 9/2015 | Lee | ......................... | H01L 33/04 257/76 |

* cited by examiner

*Primary Examiner* — Sheng Zhu

(74) *Attorney, Agent, or Firm* — H.C. Park & Associates, PLC

(57) ABSTRACT

A light emitting device includes a substrate including gallium nitride, and a semiconductor layer disposed on the substrate, the semiconductor layer including an n-type nitride semiconductor layer, an active layer disposed on the n-type nitride semiconductor layer, and a p-type nitride semiconductor layer disposed on the active layer, in which an angle defined between a crystal growth plane of the substrate and an m-plane thereof is in a range of 3.5° to 6.

25 Claims, 11 Drawing Sheets

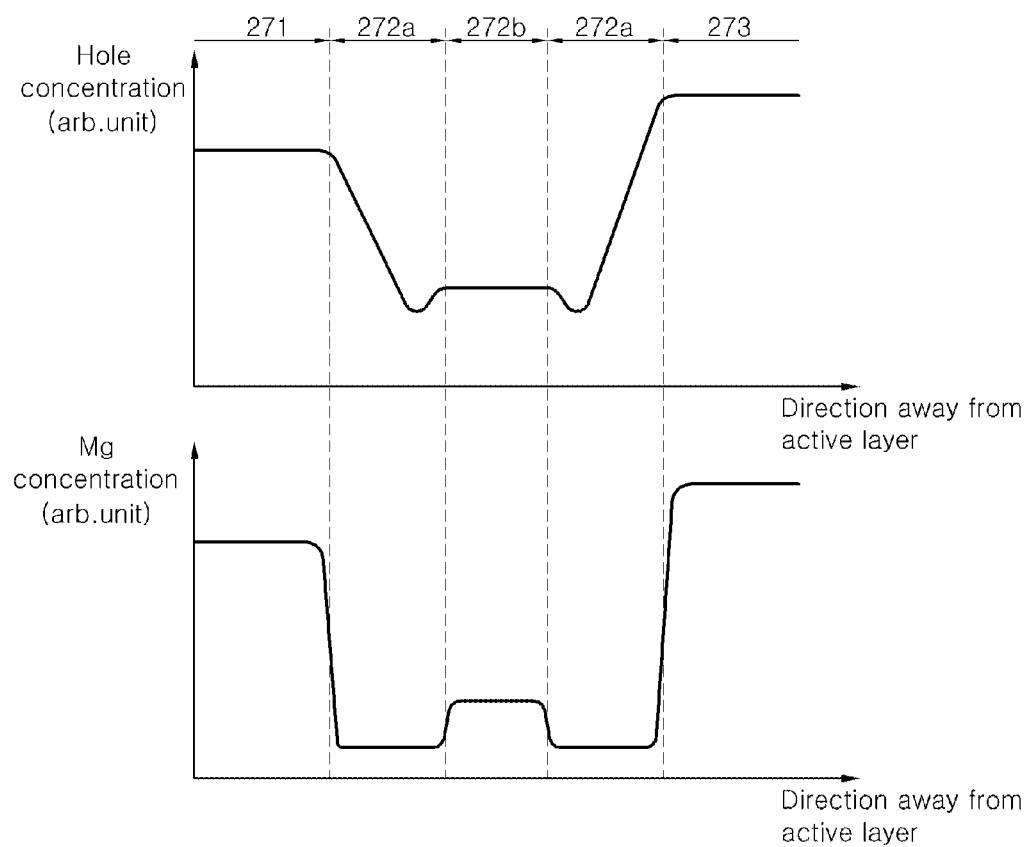

LIGHT EMITTING DEVICE WITH HIGH EFFICIENCY

CROSS-REFERENCE TO RELATED APPLICATIONS

This application claims priority from and the benefit of Korean Patent Application No. 10-2015-0126400, filed on Sep. 7, 2015, Korean Patent Application No. 10-2015-0126407, filed on Sep. 7, 2015, and Korean Patent Application No. 10-2016-0102331, filed on Aug. 11, 2016, which are hereby incorporated by reference for all purposes as if fully set forth herein.

BACKGROUND

Field

Exemplary embodiments relate to a light emitting device and, more particularly, to a light emitting device with improved internal quantum efficiency.

Discussion of the Background

Nitride semiconductors broadly used as base materials for light emitting devices, such as light emitting diodes, in recent years are produced through growth on a homogeneous substrate such as a gallium nitride substrate or a heterogeneous substrate such as a sapphire substrate. Some factors influencing crystallinity and luminous efficacy of such nitride semiconductors are associated with the characteristics of a growth substrate.

In a light emitting device including nitride semiconductors, a plane in which electrons and holes are recombined with each other is generally horizontal to a growth plane, and thus, a light emitting device may exhibit different characteristics depending upon the growth plane of the nitride semiconductors. For example, a nitride semiconductor grown on a growth substrate having a polar plane (for example, c-plane) as the growth plane may be grown in a normal direction with respect to the polar plane, which may entail spontaneous polarization and piezoelectric polarization due to a difference in lattice parameter. Such polarization effects through spontaneous polarization and piezoelectric polarization may cause an energy band of the nitride semiconductor to be bent, thereby separating distributions of holes and electrons in an active layer from each other. In this manner, the light emitting device may have low luminous efficacy from the deterioration of recombination efficiency of electrons and holes, suffer from red shift of light emission and increase in forward voltage $V_f$. Furthermore, upon growth of the c-plane, Mg in a p-type semiconductor layer may diffuse into the active layer, which may cause deterioration in internal quantum efficiency.

SUMMARY

Exemplary embodiments provide a light emitting device that has increased depth of well layers in order to improve luminous recombination while preventing a droop phenomenon.

Exemplary embodiments further provide a light emitting device that may improve luminous recombination while preventing a droop phenomenon upon application of forward bias.

Exemplary embodiments still provide a light emitting device that may prevent Mg from diffusing into an active layer while improving hole injection into the active layer.

According to an exemplary embodiment, a light emitting device includes a substrate including gallium nitride, and a semiconductor layer disposed on the substrate, the semiconductor layer including an n-type nitride semiconductor layer, an active layer disposed on the n-type nitride semiconductor layer, and a p-type nitride semiconductor layer disposed on the active layer, in which an angle defined between a crystal growth plane of the substrate and an m-plane thereof is in a range of 3.5° to 6°.

The crystal growth plane of the substrate may be at least one of (6 0 −6 1), (7 0 −7 1), and (8 0 −8 1) planes.

An angle defined between a crystal growth plane of the semiconductor layer and the m-plane of the substrate may be in a range of 3.5° to 6°.

The active layer may include (Al, Ga, In)N, a barrier layer having a thickness in a range of 12 nm to 32 nm, and a well layer having a thickness in a range of 3 nm to 10 nm.

The semiconductor layer may further include a super lattice layer disposed interposed between the n-type nitride semiconductor layer and the active layer, and the super lattice layer may include indium (In).

The semiconductor layer may further include an electron blocking layer disposed between the p-type nitride semiconductor layer and the active layer, and the electron blocking layer may include at least one of $Al_xGa_{(1-x)}N$ (0<x<1) and $Al_xIn_yGa_{(1-x-y)}N$ (0<x<1, 0<y<1, 0<x+y<1).

The electron blocking layer may have a energy band-gap greater than that of the barrier layer.

The light emitting device may further include a first hole injection layer disposed between the active layer and the p-type nitride semiconductor layer.

The first hole injection layer may include (Al, Ga, In)N and may have a dopant concentration of $1E20/cm^3$ to $5E20/cm^3$.

The semiconductor layer may further include a first undoped layer disposed between the first hole injection layer and the p-type nitride semiconductor layer.

The first undoped layer may have a dopant concentration of less than $1E18/cm^3$.

The semiconductor layer may further include an electron blocking layer disposed between the p-type nitride semiconductor layer and the first hole injection layer, and the electron blocking layer may include at least one of $Al_xGa_{(1-x)}N$ (0<x<1) and $Al_xIn_yGa_{(1-x-y)}N$ (0<x<1, 0<y<1, 0<x+y<1).

The p-type nitride semiconductor layer may include a second hole injection layer, a p-type contact layer, and a hole transfer layer disposed between the second hole injection layer and the p-type contact layer, the hole transfer layer may include a plurality of second undoped layers and at least one intermediate doped layer disposed between the second undoped layers, each of the second undoped layers may include a region having a concentration of holes gradually decreasing with increasing distance from the second hole injection layer or the p-type contact layer, and the intermediate doped layer may at least partially overlap each of the second undoped layers in a region where the concentration of holes reaches 62% to 87% of the concentration of holes of the p-type contact layer.

The first and second hole injection layers may each have a dopant concentration of $1E20/cm^3$ to $5E20/cm^3$, the p-type contact layer may have a dopant concentration of $4E20/cm^3$ to $1E21/cm^3$, the intermediate doped layer may have a dopant concentration of $1E18/cm^3$ to $1E20/cm^3$, and the second undoped layers may have a dopant concentration of less than $1E18/cm^3$.

A thickness of the hole transfer layer may be greater than a total thickness of the second hole injection layer and the p-type contact layer.

The intermediate doped layer may have a thickness in a range of 5 nm to 10 nm and each of the second undoped layers may have a thickness in a range of 3 nm to 25 nm.

The second hole injection layer may adjoin the electron blocking layer.

The intermediate doped layer may have an electrical resistance greater than an electrical resistance of the second undoped layers.

The substrate may include opposite side surfaces in a c-axis direction and opposite side surfaces in an a-axis direction, and the opposite side surfaces in the c-axis direction may include surface textures.

According to an exemplary embodiment, a light emitting device includes an n-type nitride semiconductor layer, an active layer disposed on the n-type nitride semiconductor layer, and a p-type nitride semiconductor layer disposed on the active layer, in which the active layer includes a first plane facing the p-type nitride semiconductor layer, and an angle defined between the first plane and an m-plane of the active layer may be in a range of 3.5° to 6°.

The first plane may be at least one of (6 0 –6 1), (7 0 –7 1), and (8 0 –8 1) planes.

The active layer may include (Al, Ga, In)N, a barrier layer and a well layer having a thickness in a range of 3 nm to 10 nm.

The barrier layer may have a thickness in a range of 12 nm to 32 nm.

The light emitting device may further include a first hole injection layer disposed between the active layer and the p-type nitride semiconductor layer.

The first hole injection layer may include (Al, Ga, In)N and have a dopant concentration in a range of $1E20/cm^3$ to $5E20/cm^3$.

The light emitting device may further include a first undoped layer disposed between the first hole injection layer and the p-type nitride semiconductor layer.

The first undoped layer may have a dopant concentration of less than $1E18/cm^3$.

According to exemplary embodiments, since distributions of holes and electrons present in a conduction band ($E_C$) and in a valence band ($E_V$), respectively, approach each other upon application of forward bias to the light emitting device, luminous recombination of holes and electrons increases, thereby suppressing a droop phenomenon. In addition, the light emitting device has an increased thickness of a well layer, such that Auger recombination is reduced, thereby further suppressing the droop phenomenon.

Furthermore, the light emitting device according to exemplary embodiments includes a first hole injection layer, which may prevent diffusion of Mg even without a separate semiconductor layer between the active layer and the first hole injection layer, thereby improving hole injection into the active layer and reliability of the light emitting device while simplifying a manufacturing process.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

FIG. 7 is graphs depicting concentration profiles of holes and Mg illustrating the light emitting device of FIG. 6.

DETAILED DESCRIPTION OF THE ILLUSTRATED EMBODIMENTS

Figure 1:
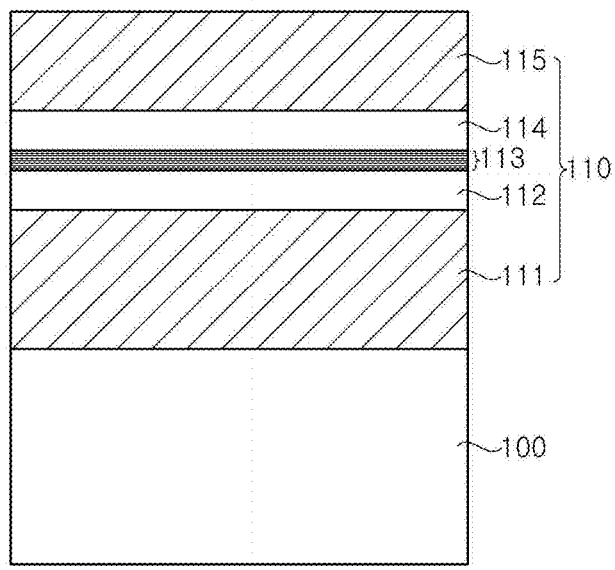
FIG. 1 is a sectional view of a light emitting device according to an exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIG. 1 is a sectional view of a light emitting device according to an exemplary embodiment.

Referring to FIG. 1, the light emitting device according to the exemplary embodiment may include a substrate 100 and a semiconductor layer 110.

The substrate 100 may support the semiconductor layer 110 and allow the semiconductor layer 110 to be grown thereon. The substrate 100 may include gallium nitride (GaN). Thus, during the growth of the semiconductor layer 110 including gallium nitride on the substrate 100, a difference in lattice parameter between the substrate 100 and the semiconductor layer 110 may be reduced to improve crystallinity of the light emitting device, which may improve internal quantum efficiency of the light emitting device.

Figure 2A:
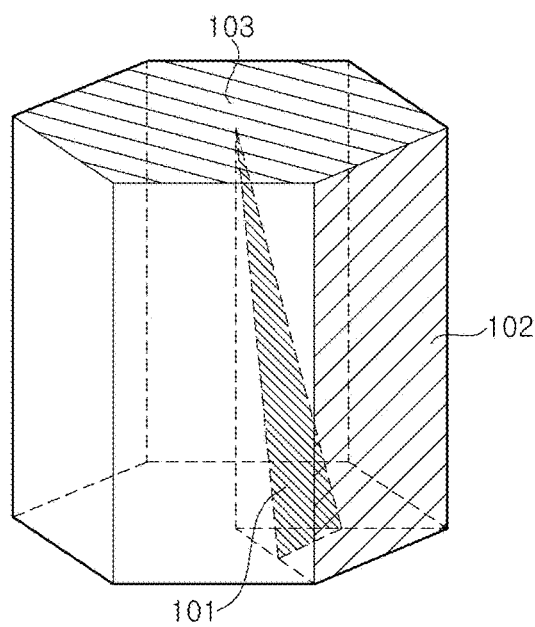
FIG. 2A and FIG. 2B show a perspective view and a conceptual view of a substrate of the light emitting device, respectively, according to an exemplary embodiment.
Figure 2B:
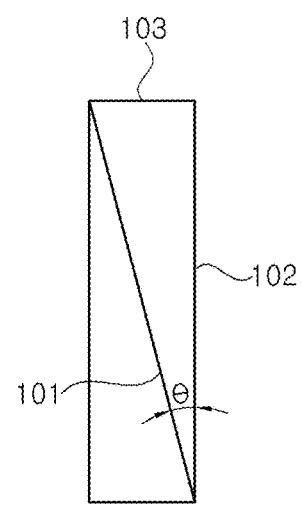

FIG. 2A and FIG. 2B show a perspective view and a conceptual view of a substrate of the light emitting device, respectively, according to an exemplary embodiment.

The substrate 100 has a crystal growth plane 101. Referring to FIG. 2B, an angle ($\theta$) defined between the crystal growth plane 101 of the substrate 100 and the (1 0 -1 1) plane of the substrate 100 may be in the range of 3.5° to 6°. Generally, the substrate 100 formed of gallium nitride may be a single crystal substrate having a crystal structure of a hexagonal system. The crystal growth plane of the substrate 100 may be at least one of a polar plane, a non-polar plane, and a semi-polar plane. The c-plane 103 corresponding to the (0 0 0 1) plane is the polar plane, the m-plane 102 corresponding to the (1 0 -1 -1) plane is the non-polar plane, and some planes of the substrate 100 may be semi-polar planes. Accordingly, the crystal growth plane 101 satisfying the angle ($\theta$) in the range of 3.5° to 6° is the semi-polar plane. Specifically, the crystal growth plane 101 of the substrate 100 may be at least one plane of the (6 0 -6 1), (7 0 -7 1), and (8 0 -8 1) planes. An upper surface of the substrate 100 may be the crystal growth plane 101 of the substrate 100.

The semiconductor layer 110 may be grown along the crystal growth plane 101 of the substrate 100. That is, the semiconductor layer 110 has the same crystal plane as the crystal growth plane 101 of the substrate 100. Accordingly, if the angle ($\theta$) defined between the crystal growth plane 101 of the substrate 100 and the (1 0 -1 1) plane of the substrate 100 is in the range of 3.5° to 6°, an angle defined between each crystal growth plane of layers constituting the semiconductor layer 110 and the m-plane of each of the layers constituting the semiconductor layer 110 may also be in the range of 3.5° to 6°. The substrate 100 may be removed from the light emitting device by laser lift-off and the like.

The semiconductor layer 110 may include an n-type nitride semiconductor layer 111, an active layer 113, and a p-type nitride semiconductor layer 115. The semiconductor layer 110 may further include a super lattice layer 112 and/or an electron blocking layer 114.

The n-type nitride semiconductor layer 111 includes a nitride semiconductor such as (Al, Ga, In)N and may be grown by a method such as MOCVD, MBE, and HVPE. The n-type nitride semiconductor layer 111 may have the same crystal growth plane as the crystal growth plane 101 of the substrate 100. Specifically, if the angle ($\theta$) defined between the crystal growth plane 101 of the substrate 100 and the (1 0 -1 1) plane of the substrate 100 is in the range of 3.5° to 6°, an angle defined between the crystal growth plane of the n-type nitride semiconductor layer 111 and the m-plane of the substrate 100 may be in the range of 3.5° to 6°. In addition, the n-type nitride semiconductor layer 111 may be doped with at least one dopant, such as Si, C, Ge, Sn, Te, and Pb, to exhibit n-type conductivity.

The super lattice layer 112 may be disposed on the n-type nitride semiconductor layer 111. The super lattice layer 112 may be formed by repeatedly stacking layers having different compositions one above another while supplying Group III element sources, such as Al, Ga, and In, and Group V element sources, such as N, into a growth chamber. For example, the super lattice layer 112 may have a stack structure in which InGaN layers and GaN layers are stacked one above another. The super lattice layer 112 may improve crystal quality of the active layer 113 by preventing transfer of stress and strain caused by lattice mismatch to the active layer 113 and propagation of defects such as dislocations.

Specifically, when the crystal growth plane 101 of the substrate 100 is tilted at an angle of 3.5° to 6° with respect to the (1 0 -1 1) plane of the substrate 100, that is, the m-plane 102 thereof, the n-type nitride semiconductor layer 111 grown on the substrate 100 includes more dislocations and stacking faults than the n-type nitride semiconductor layer 111 grown on the (0 0 0 1) plane. The super lattice layer 112 may prevent stress and strain caused by dislocations and stacking faults from being transferred to the active layer 113. The super lattice layer 112 may include the same crystal growth plane as the crystal growth plane 101 of the substrate 100.

The active layer 113 may be disposed on the n-type nitride semiconductor layer 111. Furthermore, when the light emitting device according to an exemplary embodiment includes the super lattice layer 112, the active layer 113 may be disposed on the super lattice layer 112. The active layer 113 may include a nitride semiconductor such as (Al, Ga, In)N.

Figure 3:
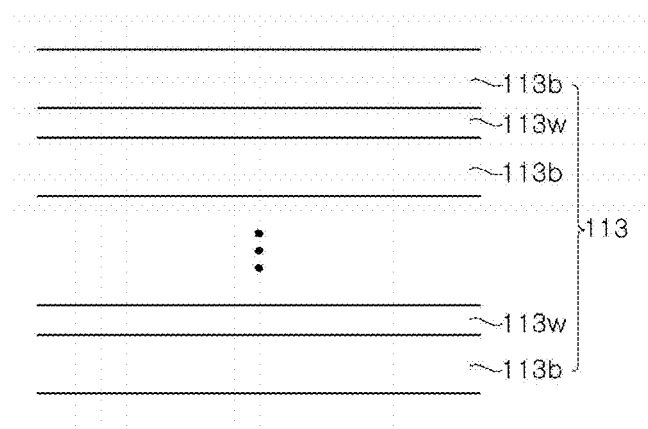
FIG. 3 is a sectional view of an active layer of the light emitting device according to an exemplary embodiment.

FIG. 3 is an enlarged sectional view of the active layer 113 of the light emitting device according to an exemplary embodiment. Referring to FIG. 3, the active layer 113 may include a multi-quantum well (MQW) structure, in which well layers 113$w$ and barrier layers 113$b$ are alternately stacked one above another in at least 2 cycles. Since the barrier layers 113$b$ may include a nitride semiconductor having a greater energy band-gap than the well layers 113$w$, a number of carriers (electrons and holes) are concentrated in the well layers 113$w$, which may increase a recombination possibility of electrons and holes. Specifically, the well layers 113$w$ may include $In_xGa_{(1-x)}N$ (0<x<1), without being limited thereto, and may further include Al.

The active layer 113 may have the same crystal growth plane as the crystal growth plane 101 of the substrate 100. Specifically, if the angle ($\theta$) defined between the crystal growth plane 101 of the substrate 100 and the (1 0 -1 1) plane of the substrate 100, that is, the m-plane 102, is in the range of 3.5° to 6°, an angle defined between the crystal growth plane of the active layer 113 and the m-plane of the substrate 100 is also in the range of 3.5° to 6°.

The active layer 113 may include a first plane facing the p-type nitride semiconductor layer 115. As described above, since the active layer 113 is grown along the crystal growth plane 101 of the substrate 100, an angle defined between the first plane of the active layer 113 and the m-plane of the substrate 100 may be in the range of 3.5° to 6°. Specifically, the first plane of the active layer 113 may be at least one of (6 0 -6 1), (7 0 -7 1), and (8 0 -8 1) planes.

Figure 4A:
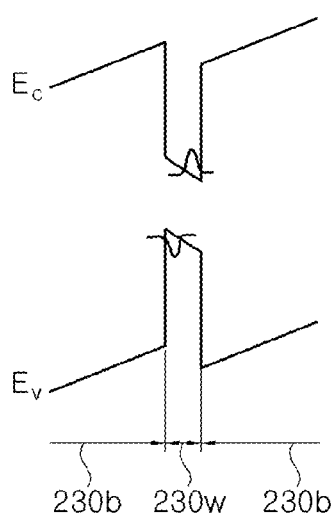
FIG. 4A and FIG. 4B show conceptual views of an active layer of a typical light emitting device.
Figure 4B:
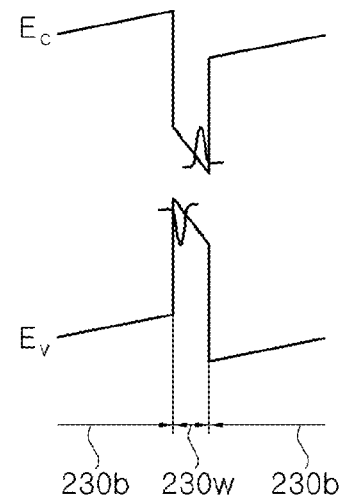
Figure 4C:
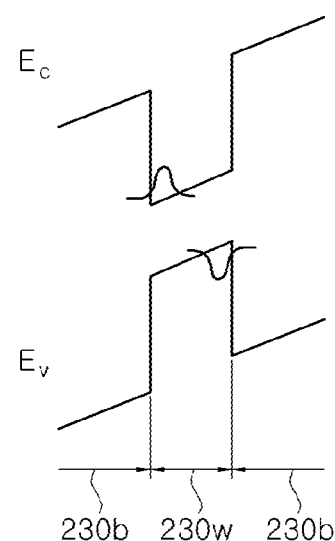
FIG. 4C and FIG. 4D show conceptual views of an active layer of a light emitting device according to an exemplary embodiment.
Figure 4D:
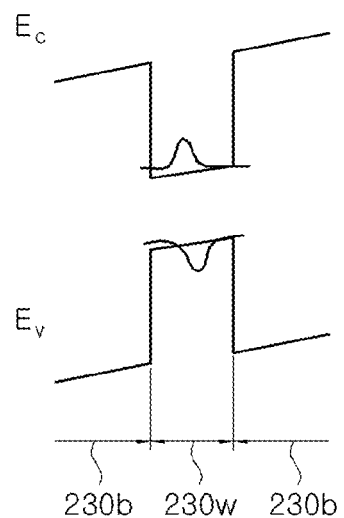

FIG. 4A and FIG. 4B show conceptual views of an active layer of a typical light emitting device, respectively, and FIG. 4C and FIG. 4D show the active layer of the light emitting device, which has the same crystal growth plane as the crystal growth plane 101 of the substrate 100, according to an exemplary embodiment. In each of the drawings, the barrier layer 113$b$ adjacent the n-type nitride semiconductor layer 111 is disposed at the left side, the barrier layer 113$b$ adjacent the p-type nitride semiconductor layer 115 is disposed at the right side, and the well layer 113$w$ is disposed between the barrier layers 113$b$. The active layer having the c-plane as the crystal growth plane has a band-diagram as shown in FIGS. 4A and 4B due to effects of spontaneous polarization and piezoelectric polarization. More particularly, upon application of forward bias, the slope of the band-diagram of the well layer 113$w$ becomes steeper, and thus, distributions of holes and electrons present in a conduction band ($E_C$) and in a valence band ($E_V$), respectively, are further separated from each other. As a result, the light emitting device has low luminous efficacy caused by deterioration in recombination efficiency of electrons and holes, and may suffer from red shift of light emission and increase in forward voltage $V_f$. Thus, although the well layers 113w of the active layer are formed to a predetermined thickness or less in order to improve recombination efficiency, decrease in thickness of the well layers 113w may cause a severe droop phenomenon due to increase in Auger recombination.

Referring to FIGS. 4C and 4D, since the active layer 113 according to an exemplary embodiment has the crystal growth plane tilted at an angle of 3.5° to 6° with respect to the (1 0 −1 1) plane of the substrate 100, that is, the first plane tilted at an angle of 3.5° to 6° with respect to the m-plane of the active layer 113, the active layer 113 has a different band-diagram than the active layer illustrated with reference to FIGS. 4A and 4B, which have the c-plane as the crystal growth plane.

Referring to FIG. 4C, since the active layer 113 according to an exemplary embodiment is affected by piezoelectric polarization in an opposite direction to the active layer grown on the c-plane, the well layer 113w of the active layer 113 has a band-diagram having a slope that is in an opposite direction to the slope of the band-diagram shown in FIG. 4A. Upon application of forward bias, the slope of the band-diagram of the well layer 113w becomes gentle and the distributions of holes and electrons present in the conduction band ($E_C$) and in the valence band ($E_V$), respectively, approach each other. In this manner, the light emitting device has increased recombination efficiency of holes and electrons, thereby suppressing the droop phenomenon.

Furthermore, since the distributions of holes and electrons in the conduction band ($E_C$) and the valence band ($E_V$) approach each other upon application of forward bias, the thickness of the well layer 113w may be increased. The well layer 113w may have a thickness of 3 nm to 10 nm, specifically 5 nm to 10 nm, more specifically 7 nm to 10 nm. Within this thickness range, the well layer 113w allows electrons to be present in a broad distribution therein, thereby further suppressing the droop phenomenon through reduction in Auger recombination.

The barrier layer 113b may include GaN, without being limited thereto, and may further include Al. The barrier layer 113b may have a thickness of 12 nm to 32 nm, specifically 12 nm to 28 nm, more specifically, 12 nm to 24 nm. If the crystal growth plane 101 of the substrate 100 is tilted at an angle of 3.5° to 6° with respect to the (1 0 −1 1) plane of the substrate 100, the n-type nitride semiconductor layer 111 grown on the substrate 100 includes more dislocations and stacking faults than the n-type nitride semiconductor layer 111 grown on the (0 0 0 1) plane. Within this thickness range, the barrier layer 113b may prevent stress and strain caused by dislocations and stacking faults from being transferred to the interior of the active layer 113 and to other layers on the active layer 113.

The electron blocking layer 114 may be disposed on the active layer 113. The electron blocking layer 114 may include a nitride semiconductor such as (Al, Ga, In)N. For example, the electron blocking layer 114 may include at least one of $Al_xGa_{(1-x)}N$ (0<x<1) and $Al_xIn_yGa_{(1-x-y)}N$ (0<x<1, 0<y<1, 0<x+y<1). The electron blocking layer 114 may prevent deterioration of recombination efficiency by preventing electrons supplied from the n-type nitride semiconductor layer 111 to the active layer 113 from moving towards the p-type nitride semiconductor layer 115. Specifically, referring to FIG. 4D, unlike the active layer grown on the c-plane, since the barrier layer 113b of the active layer 113 according to an exemplary embodiment has a conduction band ($E_C$), which gradually decreases towards the p-type nitride semiconductor layer 115, excited electrons having an energy equal to or greater than an energy band gap between the barrier layer 113b and the well layer 113w may be easily moved towards the p-type nitride semiconductor layer 115. The electron blocking layer 114 may improve recombination efficiency by preventing movement of such electrons. To this end, the electron blocking layer 114 may have a greater energy band-gap than the barrier layer 113b of the active layer 113.

Further, the electron blocking layer 114 may be doped to exhibit the same conductivity type as the p-type nitride semiconductor layer 115. For example, the electron blocking layer 114 may be doped with Mg dopants to exhibit p-type conductivity. In an exemplary embodiment, the electron blocking layer 114 may have a higher dopant concentration than the p-type nitride semiconductor layer 115. Since the electron blocking layer 114 is doped to exhibit p-type conductivity, hole injection efficiency into the active layer 113 may be improved. The electron blocking layer 114 may have a thickness of, for example, about 80 nm, but is not limited thereto. The electron blocking layer 114 may have the same crystal growth plane as the crystal growth plane 101 of the substrate 100.

The p-type nitride semiconductor layer 115 may be disposed on the active layer 113. Furthermore, when the light emitting device includes the electron blocking layer 114, the p-type nitride semiconductor layer 115 may be disposed on the electron blocking layer 114. The p-type nitride semiconductor layer 115 may include a nitride semiconductor such as (Al, Ga, In)N. The p-type nitride semiconductor layer 115 may be doped to exhibit an opposite conductivity type to the n-type nitride semiconductor layer 111. For example, the p-type nitride semiconductor layer 115 may be doped with Mg dopants to exhibit p-type conductivity. The p-type nitride semiconductor layer 115 may include a delta doped layer (not shown) for decreasing ohmic contact resistance. The p-type nitride semiconductor layer 115 may have the same crystal growth plane as the crystal growth plane 101 of the substrate 100. Specifically, if the crystal growth plane 101 of the substrate 100 is tilted at an angle of 3.5° to 6° with respect to the (1 0 −1 1) plane of the substrate 100, that is, the m-plane thereof, an angle defined between the crystal growth plane of the p-type nitride semiconductor layer 115 and the m-plane of the substrate 100 may be in the range of 3.5° to 6°.

Figure 5:
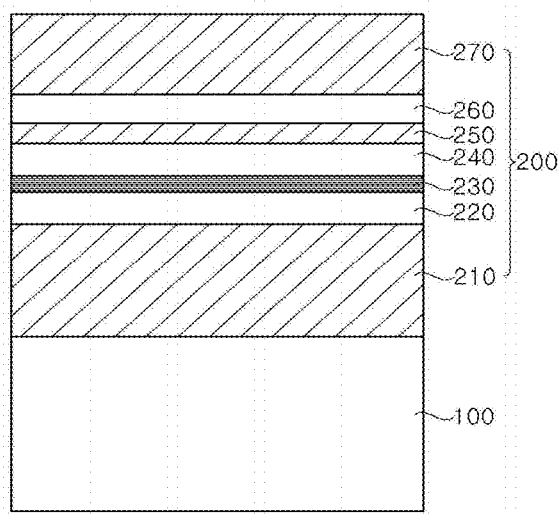
FIG. 5 is a sectional view of a light emitting device according to an exemplary embodiment.

FIG. 5 is a sectional view of a light emitting device according to an exemplary embodiment.

Referring to FIG. 5, the light emitting device according to an exemplary embodiment includes a substrate 100 and a semiconductor layer 200.

The substrate 100 may support the semiconductor layer 200 and allow the semiconductor layer 200 to be grown thereon. The substrate 100 of the light emitting device according to an exemplary embodiment is the same as the substrate described with reference to FIG. 1, and thus, repeated descriptions thereof will be omitted.

The semiconductor layer 200 may be grown along the crystal growth plane 101 of the substrate 100. More particularly, the semiconductor layer 200 has the same crystal plane as the crystal growth plane 101 of the substrate 100. Accordingly, if the angle (θ) defined between the crystal growth plane 101 of the substrate 100 and the (1 0 −1 1) plane of the substrate 100 is in the range of 3.5° to 6°, an angle defined between each crystal growth plane of layers constituting the semiconductor layer 200 and the m-plane of each of the layers constituting the semiconductor layer 200 may also be in the range of 3.5° to 6°. The substrate 100 may be removed from the light emitting device by laser lift-off and the like.

The semiconductor layer 200 may include an n-type nitride semiconductor layer 210, an active layer 230, a first hole injection layer 240, and a p-type nitride semiconductor layer 270. The semiconductor layer 200 may further include a super lattice layer 220 and/or an electron blocking layer 260.

The n-type nitride semiconductor layer 210, the active layer 230, the super lattice layer 220, and the electron blocking layer 260 are the same as the n-type nitride semiconductor layer 111, the active layer 113, the super lattice layer 112, and the electron blocking layer 114 of the light emitting device described above with reference to FIG. 1, and thus, repeated descriptions thereof will be omitted.

Unlike the exemplary embodiment shown in FIG. 1, the first hole injection layer 240 may be disposed on the active layer 230. The first hole injection layer 240 may improve internal quantum efficiency by increasing the density of holes to be injected into the active layer 230. Specifically, the first hole injection layer 240 may adjoin (or contact) the active layer 230. More specifically, a separate undoped layer may not be disposed between the first hole injection layer 240 and the active layer 230. If an angle defined between a crystal growth plane of the p-type nitride semiconductor layer 270 and the m-plane of the substrate 100 is in the range of 3.5° to 6°, since Mg in the p-type nitride semiconductor layer 270 may not diffuse into the active layer 230, a separate undoped layer for diffusion of Mg, which is typically disposed between the active layer 230 and the first hole injection layer 240, may be omitted. As a result, a process of manufacturing the light emitting device may be simplified. The first hole injection layer 240 may include a nitride semiconductor, specifically (Al, Ga, In)N. In addition, the first hole injection layer 240 may include dopants at a concentration of $1E20/cm^3$ to $5E20/cm^3$.

A first undoped layer 250 has a much lower concentration of dopants than the first hole injection layer 240. For example, the first undoped layer 250 includes Mg or substantially no dopants. Specifically, the first undoped layer 250 may have a dopant concentration of less than $1E18/cm^3$. Due to a low dopant concentration of the first undoped layer 250, the first undoped layer 250 may be formed to have a lower defect density than semiconductor layers formed under the first undoped layer 250, thereby improving crystal quality of semiconductor layers formed on the first undoped layer 250. Further, in the p-type nitride semiconductor layer 270, holes moving towards the active layer 230 may be effectively dispersed in the horizontal direction, thereby providing uniform distribution of light in the light emitting device.

In an exemplary embodiment, the electron blocking layer 260 may be disposed on the first hole injection layer 240. When the light emitting device further includes the first undoped layer 250, the electron blocking layer 260 may be disposed on the first undoped layer 250. The electron blocking layer 260 is similar to the electron blocking layer 114 described with reference to FIG. 1, except for the structural location of the electron blocking layer 260. As such, detailed descriptions of the material, functions, energy band-gap, conductivity type, doping concentration, thickness, and crystal growth plane of the electron blocking layer 260 will be omitted.

The p-type nitride semiconductor layer 270 may be disposed on the first hole injection layer 240. When the light emitting device includes the electron blocking layer 260, the p-type nitride semiconductor layer 270 may be disposed on the electron blocking layer 260. The p-type nitride semiconductor layer 270 is similar to the p-type nitride semiconductor layer 115 described with reference to FIG. 1, and thus, repeated descriptions thereof will be omitted.

The p-type nitride semiconductor layer 270 may also have the same crystal growth plane as the crystal growth plane 101 of the substrate 100. Specifically, if the angle (θ) defined between the crystal growth plane 101 of the substrate 100 and the (1 0 –1 1) plane of the substrate 100, that is, the m-plane of the substrate 100, is in the range of 3.5° to 6°, an angle defined between the crystal growth plane of the p-type nitride semiconductor layer 270 and the m-plane of the substrate 100 may be in the range of 3.5° to 6°.

The p-type nitride semiconductor layer 270 may include a first plane placed in an opposite direction to the active layer 230. As described above, since the p-type nitride semiconductor layer 270 is grown along the crystal growth plane 101 of the substrate 100, an angle defined between the first plane of the p-type nitride semiconductor layer 270 and the m-plane of the p-type nitride semiconductor layer 270 may be in the range of 3.5° to 6°. Specifically, the first plane of the p-type nitride semiconductor layer 270 may be at least one of (6 0 –6 1), (7 0 –7 1), and (8 0 –8 1) planes.

In this structure of the p-type nitride semiconductor layer 270, Mg in the p-type nitride semiconductor layer 270 may not be diffused into the active layer 230.

Figure 6:
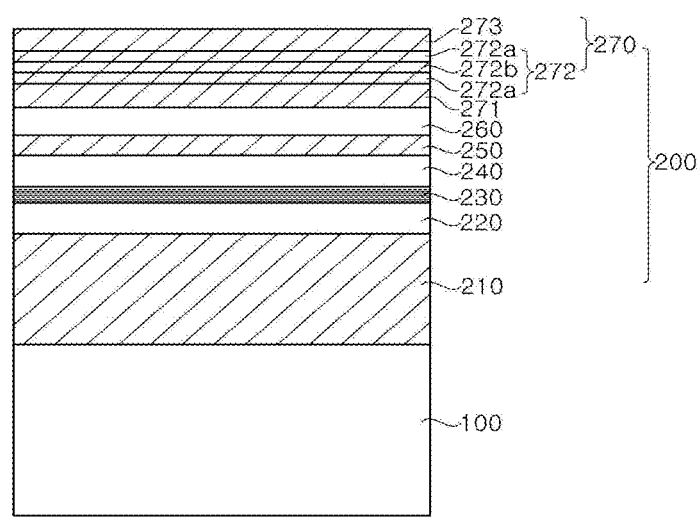
FIG. 6 is a sectional view of a light emitting device according to an exemplary embodiment.

FIG. 6 is a sectional view of a light emitting device according to an exemplary embodiment.

Referring to FIG. 6, the light emitting device according to the exemplary embodiment is similar to the light emitting device described with reference to FIG. 5, except that a p-type nitride semiconductor layer 270 includes a second hole injection layer 271, a hole transfer layer 272, and a p-type contact layer 273. The following description will be focused on different features in order to avoid repeated descriptions.

The second hole injection layer 271, the hole transfer layer 272, and the p-type contact layer 273 may be formed of a gallium nitride-based semiconductor, for example, GaN, and may have the same composition except for dopant concentrations. Accordingly, holes supplied from an electrode (not shown) may pass through the p-type nitride semiconductor layer 270 without being blocked by an energy barrier. The second hole injection layer 271 may adjoin the electron blocking layer 260. Further, the p-type contact layer 273 may contact the electrode (not shown).

The thickness of the hole transfer layer 272 may be greater than the total thickness of the second hole injection layer 271 and the p-type contact layer 273. For example, the second hole injection layer 271 may have a thickness of 5 nm to 20 nm, the hole transfer layer 272 may have a thickness of 16 nm to 100 nm, and the p-type contact layer 273 may have a thickness of 10 nm to 30 nm. Further, in the hole transfer layer 272, each of second undoped layers 272a may have a thickness of 3 nm to 25 nm and an intermediate doped layer 272b may have a thickness of 2 nm to 10 nm. For example, each of the second undoped layers 272a may have a thickness of about 22 nm and the intermediate doped layer 272b may have a thickness of about 10 nm, and thus, the hole transfer layer 272 including the second undoped layers 272a and the intermediate doped layer 272b may have a thickness of about 54 nm, without being limited thereto.

The second hole injection layer 271 may have a dopant concentration of $1E20/cm^3$ to $5E20/cm^3$, and the p-type contact layer 273 may have a dopant concentration of 4E20/cm³ to 1E21/cm³. Further, in the hole transfer layer 272, the intermediate doped layer 272b may have a dopant concentration of 1E18/cm³ to 1E20/cm³, and the second undoped layers 272a may have a dopant concentration of less than 1E18/cm³. In an exemplary embodiment, the intermediate doped layer 272b may have a dopant concentration of less than 1E19/cm³, but is not limited thereto.

In an exemplary embodiment, the hole transfer layer 272 may have a relatively high thickness and includes the intermediate doped layer 272b therein, in order to achieve significant increase in hole mobility, thereby improving hole injection into the active layer 230. The following description will focus on this structure.

Holes injected into the p-type contact layer 273 may diffuse into the hole transfer layer 272 along a hole diffusion distance. The hole diffusion distance may be represented by Equation 1.

$$Lp = \sqrt{u \times t} \qquad \text{Equation 1.}$$

In Equation 1, Lp denotes the hole diffusion distance, u denotes mobility of the holes, and t denotes life time of the holes.

According to Equation 1, the holes in the p-type contact layer 273 may diffuse into the hole transfer layer 272, and the hole diffusion distance may refer to a distance from the p-type contact layer 273 to a point at which the concentration of holes becomes 0. If the concentration of holes is sufficiently higher than the concentration of electrons, the concentration of holes diffusing into the hole transfer layer 272 may decrease with increasing distance from the p-type contact layer 273 or the second hole injection layer 271. In an exemplary embodiment, the hole transfer layer 272 includes the second undoped layers 272a, and each of the second undoped layers 272a may include a region in which the concentration of holes gradually decreases in proportion to the distance from the p-type contact layer 273 or the second hole injection layer 271. The region in which the concentration of holes gradually decreases may include a region in which the concentration of holes linearly decreases with increasing distance from the p-type contact layer 273, but is not limited thereto. The concentration of holes may non-linearly decrease, and in the hole transfer layer 272, the concentration gradient of holes may be changed in a direction away from the p-type contact layer 273 or the second hole injection layer 271. Furthermore, the second undoped layers 272a may include a region in which the concentration of holes gradually increases with decreasing distance to the intermediate doped layer 272b. The region in which the concentration of holes gradually increases may include a region in which the concentration of holes linearly increases with decreasing distance to the intermediate doped layer 272b, but is not limited thereto.

For example, FIG. 7 is a graph depicting concentration profiles of holes and Mg illustrating the light emitting device according to an exemplary embodiment. A graph at a lower side of FIG. 7 depicts a concentration of p-type dopants, that is, Mg, in a direction away from the active layer, and a graph at an upper side of FIG. 7 depicts a concentration of holes in the direction away from the active layer.

Referring to FIG. 7, each of the second hole injection layer 271, the p-type contact layer 273, and the intermediate doped layer 272b includes a predetermined concentration of p-type dopants (Mg). The second hole injection layer 271 may have a higher concentration of Mg than the intermediate doped layer 272b, and the p-type contact layer 273 may have a higher concentration of Mg than the second hole injection layer 271. Conversely, the second undoped layers 272a may include much lower concentration of Mg than the second hole injection layer 271, the p-type contact layer 273, and the intermediate doped layer 272b, or may include substantially no Mg. The second undoped layers 272a may be grown while stopping implantation of Mg sources, so as to have an Mg concentration of substantially 0. That is, the second undoped layers 272a are not intended to include the p-type dopants. Nevertheless, the second undoped layers 272a may include a trace of Mg, due to Mg sources remaining in the growth chamber, and after growth, the second undoped layers 272a may include Mg diffused from at least one of the second hole injection layer 271, the p-type contact layer 273, and the intermediate doped layer 272b. Thus, it is contemplated that the second undoped layers 272a including a small amount of Mg also falls within the scope of exemplary embodiments.

As shown in FIG. 7, the second hole injection layer 271 has a predetermined concentration of holes, and the second undoped layer 272a near the second hole injection layer 271 has a concentration of holes gradually decreasing in the direction away from the active layer 230. Here, the concentration of holes may linearly decrease at least in some zones. In the second undoped layer 272a near the second hole injection layer 271, the concentration of holes may gradually decrease with increasing distance from the second hole injection layer 271, and then, may gradually increase with decreasing distance to the intermediate doped layer 272b. Likewise, in the second undoped layer 272a near the p-type contact layer 273, the concentration of holes may decrease with increasing distance from the intermediate doped layer 272b, and then, may gradually increase with decreasing distance to the p-type contact layer 273. Here, the concentration of holes may linearly decrease at least in some zones.

In an exemplary embodiment, the intermediate doped layer 272b may contact the second undoped layer 272a in a region of the hole transfer layer 272, in which the linearly decreasing concentration of holes reaches 62% to 87% of the concentration of holes in the p-type contact layer 273. More particularly, the intermediate doped layer 272b may be disposed to at least partially overlap the second undoped layer 272a in the region of the hole transfer layer, in which the concentration of holes reaches 62% to 87% of the concentration of holes in the p-type contact layer 273. As such, the intermediate doped layer 272b doped with a predetermined concentration of dopants is disposed in the hole transfer layer 272 including the second undoped layers 272a, thereby improving mobility of holes. That is, since the intermediate doped layer 272b is disposed in a region of the hole transfer layer 272, in which the concentration of holes supplied from the p-type contact layer 273 is reduced to a predetermined concentration, the intermediate doped layer 272b may improve mobility of holes in the hole transfer layer 272, whereby a hole injection rate into the active layer 230 may be improved, thereby improving internal quantum efficiency. In an exemplary embodiment, the intermediate doped layer 272b may be disposed closer to the second hole injection layer 271 than to the p-type contact layer 273, but is not limited thereto.

Further, in the light emitting devices according to exemplary embodiments, the intermediate doped layer 272b may have relatively high resistance. Thus, when static electricity flows through the light emitting device, electric current caused by static electricity may be blocked by the intermediate doped layer 272b having high resistance, thereby improving anti-static discharge performance of the light emitting device.

The light emitting devices according to exemplary embodiments are manufactured to have an electrode structure. The following description will be given of flip-chip or vertical type light emitting devices. It is contemplated that, however, electrode structures of the light emitting devices may be variously modified.

Figure 8A:
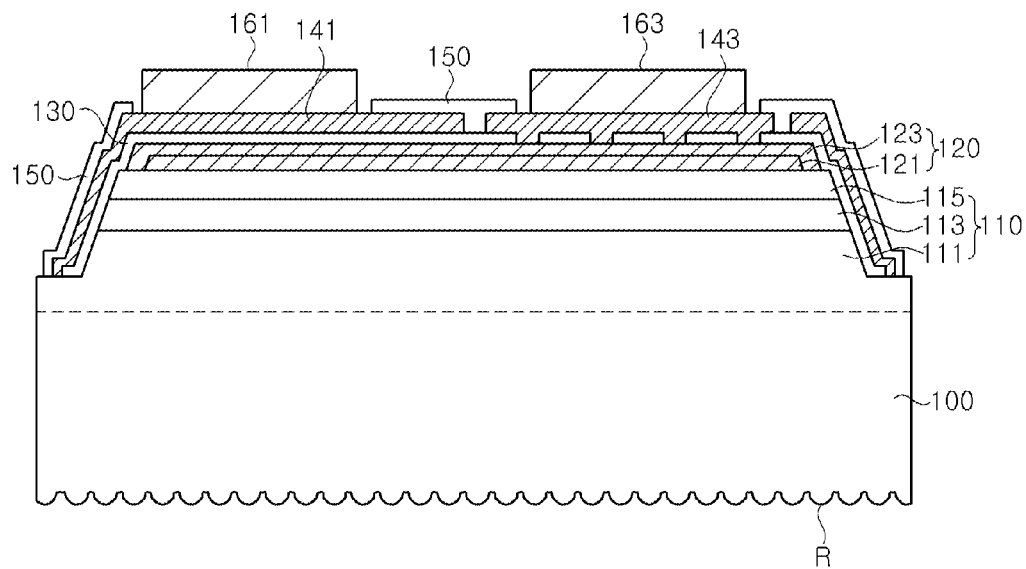
FIG. 8A and FIG. 8B show sectional views of flip-chip type and vertical type light emitting devices according to exemplary embodiments.
Figure 8B:
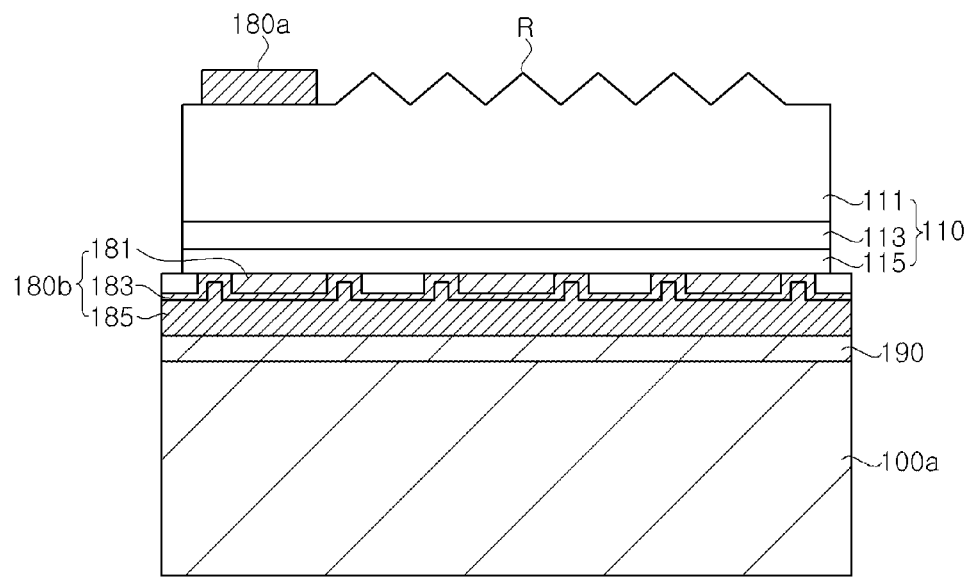

FIG. 8A and FIG. 8B are sectional views of flip-chip and vertical type light emitting devices according to exemplary embodiments, respectively.

Referring to FIG. 8A, the flip-chip type light emitting device includes a substrate 100, a semiconductor layer 110, a reflective electrode structure 120, a lower insulation layer 130, a first electrode 141, an intermediate electrode 143, an upper insulation layer 150, a first bonding pad 161, and a second bonding pad 163.

The substrate 100 is the same as the substrate described with reference to FIG. 1, and thus, repeated descriptions thereof will be omitted. In addition, the semiconductor layer 110 is the same as the semiconductor layer 110 described with reference to FIG. 1, and the n-type nitride semiconductor layer 111, the active layer 113, and the p-type nitride semiconductor layer 115 are schematically shown in FIG. 8A. Alternatively, the semiconductor layer 110 may be the same as the semiconductor layer 200 described with reference to FIG. 5 and FIG. 6.

The semiconductor layer 110 is partially removed by mesa etching so as to expose an n-type compound semiconductor layer 111. The substrate 100 may have the same crystal structure as the n-type compound semiconductor layer 111, and thus, a border between the substrate 100 and the n-type compound semiconductor layer 111 may not be clearly defined. In an exemplary embodiment, since the n-type compound semiconductor layer 111 has a higher concentration of n-type dopants than the substrate 100, the presence of the substrate 100 and the n-type compound semiconductor layer 111 may be identified through composition analysis, such as secondary ion mass spectrometry (SIMS).

The reflective electrode structure 120 is disposed on a p-type compound semiconductor layer 115. The reflective electrode structure 120 may form ohmic contact with the p-type compound semiconductor layer 115. The reflective electrode structure 120 may include, for example, an ohmic reflection metal layer 121 and a barrier metal layer 123. The ohmic reflection metal layer 121 may include Ag and may be formed of Ni/Ag. The barrier metal layer 123 may include Ni and cover the ohmic reflection metal layer 121 to prevent diffusion of metal atoms such as Ag.

The lower insulation layer 130 is formed on the reflective electrode structure 120 and covers a side surface of the semiconductor layer 110. The lower insulation layer 130 may be formed of $SiO_2$ or $Si_3N_4$, or may be formed as a distributed Bragg reflector including insulation materials. The lower insulation layer 130 is formed to expose an upper surface of the n-type compound semiconductor layer 111 and a part of the reflective electrode structure 120.

The first electrode 141 and the intermediate electrode 143 may be formed on the lower insulation layer 130. The first electrode 141 is electrically connected to the n-type compound semiconductor layer 111 exposed through the lower insulation layer 130. At least part of the first electrode 141 may be disposed on an upper surface of the reflective electrode structure 120 and is insulated from the reflective electrode structure 120 by the lower insulation layer 130.

The intermediate electrode 143 is separated from the first electrode 141 and is electrically connected to the reflective electrode structure 120 exposed through the lower insulation layer 130. The lower insulation layer 130 may include a plurality of openings through which the reflective electrode structure is exposed, and the intermediate electrode 143 may be connected to the reflective electrode structure 120 through these openings. Accordingly, an upper surface of the first electrode 141 may be flush with an upper surface of the intermediate electrode 143.

The first electrode 141 and the intermediate electrode 143 may be formed of the same metal layer by the same process. For example, the first electrode 141 and the intermediate electrode 143 may be formed by depositing a metal layer, followed by patterning through photolithography and etching, or may be formed at the same time through a lift-off process.

The upper insulation layer 150 is formed on the first electrode 141 and the intermediate electrode 143. The upper insulation layer 150 covers the first electrode 141 to protect the first electrode 141, and may also cover part of the intermediate electrode 143. For example, the upper insulation layer 150 may cover an edge of the intermediate electrode 143. As shown in FIG. 8A, the upper insulation layer 150 exposes the first electrode 141 and the intermediate electrode 143. The upper insulation layer 150 may be formed of $SiO_2$ or $Si_3N_4$, or may be formed as a distributed Bragg reflector including insulation materials.

The first bonding pad 161 and the second bonding pad 163 are disposed on the first electrode 141 and the intermediate electrode 143 exposed through the upper insulation layer 150, respectively. The first bonding pad 161 and the second bonding pad 163 may be formed of, for example, AuSn. Since the first electrode 141 and the intermediate electrode 143 are placed at the same height, an upper surface of the first bonding pad 161 may be flush with an upper surface of the second bonding pad 163. Accordingly, the light emitting device according to an exemplary embodiment may be easily bonded to a submount having electrode pads flush with each other through flip bonding.

A surface texture R may be formed on a light exit plane of the substrate 100 through surface machining, in order to improve light extraction efficiency. As shown in FIG. 8A, the surface texture R may include rounded protrusions. Shapes of the surface texture R may be varied.

Referring to FIG. 8B, the vertical type light emitting device includes a substrate 100a, a semiconductor layer 110, a first electrode 180a, a second electrode 180b, and a bonding metal layer 190.

The substrate 100a is distinguished from a growth substrate for growth of the semiconductor layer 110. The substrate 100a is a support substrate bonded to the semiconductor layer 110. The substrate 100a may be selected from any substrate without limitation, and may be, for example, a metal substrate.

The semiconductor layer 110 may be the same as the semiconductor layer 110 or the semiconductor layer 200 of the aforementioned exemplary embodiments, and a repeated description thereof will be omitted.

A rough surface R may be formed on a surface of the n-type compound semiconductor layer 111 by surface texturing. The rough surface R improves light extraction efficiency.

The semiconductor layer 110 may be grown on the substrate 100 described with reference to FIG. 1. Then, the semiconductor layer 110 is bonded to the substrate 100a, and the substrate 100 used as the growth substrate is removed from the semiconductor layer 110.

The first electrode 180a may be disposed on an upper surface of the semiconductor layer 110. The light emitting device according to an exemplary embodiment may include at least one first electrode 180a, which may be electrically connected to the n-type compound semiconductor layer 111. The first electrode 180a may include Ni, Al, Au, Cr, or a combination thereof, and have a single layer or multiple layers structure. The first electrode 180a may be formed by depositing a metallic material on the semiconductor layer 110, followed by patterning.

A lower surface of the first electrode 180a adjoins the upper surface of the n-type compound semiconductor layer 111. When the n-type compound semiconductor layer 111 includes the rough surface (R), the first electrode 180a may be formed on the rough surface (R), or may be formed on a flat surface, as shown in FIG. 8B. Although only the first electrode 180a having a pad shape is shown in FIG. 8B, the first electrode 180a may include an extension extending from the pad.

A current blocking layer 170 may be disposed on a lower surface of the semiconductor layer 110, that is, between the semiconductor layer 110 and the substrate 100a. The current blocking layer 170 at least partially overlaps the first electrode 180a in the vertical direction, so as to prevent electric current from crowding in a region directly under the first electrode 180a. The current blocking layer 170 may include an insulation material. For example, the current blocking layer 170 may include $SiO_x$ or $SiN_x$, or may include a distributed Bragg reflector (DBR), in which insulation material layers having different refractive indices are stacked one above another. The current blocking layer 170 may have a single layer or multiple layers structure through chemical vapor deposition (CVD) and the like. The current blocking layer 170 is formed to expose the p-type compound semiconductor layer 115.

The second electrode 180b may be disposed on a lower surface of the semiconductor layer 110. The second electrode 180b is electrically connected to the p-type compound semiconductor layer 115. The second electrode 180b may include a first reflective metal layer 181, a second reflective metal layer 183, and a barrier metal layer 185.

The first reflective metal layer 181 may contact the p-type compound semiconductor layer 115 exposed through the current blocking layer 170. Further, the first reflective metal layer 181 may form ohmic contact with the p-type compound semiconductor layer 115. The first reflective metal layer 181 may include a metal or an alloy capable of reflecting light generated from the semiconductor layer 110. For example, the first reflective metal layer 181 may include an Ag layer, an Ag alloy layer, Ni/Ag layers, NiZn/Ag layers, TiO/Ag layers, or Ni/Ag/Ni/Ti layers, and may be formed by deposition and patterning. Particularly, Ni is used for the first reflective metal layer 181 to form ohmic contact with the p-type compound semiconductor layer 115. Since Ni has low reflectivity with respect to light generated from the semiconductor layer 110 and reduces reflectivity of Ag, the first reflective metal layer 181 formed of Ni may have a small thickness. The first reflective metal layer 181 may be formed by e-beam evaporation, vacuum deposition, sputtering, metal organic chemical vapor deposition (MOCVD), and the like.

The second reflective metal layer 183 may cover the current blocking layer 170 and the first reflective metal layer 181. Specifically, the second reflective metal layer 183 may cover lower and side surfaces of the current blocking layer 170 and lower and side surfaces of the first reflective metal layer 181. The second reflective metal layer 183 may adjoin the current blocking layer 170 and the first reflective metal layer 181. Furthermore, the second reflective metal layer 183 may adjoin the p-type compound semiconductor layer 115 in a region between the current blocking layer 170 and the first reflective metal layer 181.

The second reflective metal layer 183 may be disposed between the current blocking layer 170 and the barrier metal layer 185 described below, and between the first reflective metal layer 181 and the barrier metal layer 185.

The second reflective metal layer 183 may include a metal having a different reflectance than that of the first reflective metal layer 181. Specifically, when the first reflective metal layer 181 includes Ag, the second reflective metal layer 183 may include Al. Further, the second reflective metal layer 183 may be formed of a metal having a higher work function than the first reflective metal layer 181. Specifically, the second reflective metal layer 183 may form a Schottky junction with the p-type compound semiconductor layer 115. When a contact area between the current blocking layer 170 and the p-type compound semiconductor layer 115 is wide, a reflection area of the second electrode 180b is decreased, thereby reducing light extraction efficiency. Conversely, a narrow contact area therebetween may deteriorate current spreading efficiency of the light emitting device. Thus, in an exemplary embodiment, the second reflective metal layer 183 forming the Schottky junction is formed to adjoin the p-type compound semiconductor layer 115, thereby improving current spreading efficiency and light extraction efficiency, while minimizing the area of the current blocking layer 170.

When the current blocking layer 170 includes the distributed Bragg reflector (DBR), the current blocking layer 170 may reflect light in a wide wavelength band. Particularly, when the active layer 113 is configured to emit near UV light, the near UV light may be reflected by the distributed Bragg reflector (DBR), thereby improving light extraction efficiency. On the other hand, the second reflective metal layer 183 disposed under the current blocking layer 170 reflects light having passed through the current blocking layer 170, to improve light extraction efficiency. Particularly, when the current blocking layer 170 includes the distributed Bragg reflector (DBR), the light emitting device may maintain high reflectance using the current blocking layer 170 and the second reflective metal layer 183. Particularly, a combination of the second reflective metal layer 183 and the current blocking layer 170 may maintain high reflectance with respect to light incident on the current blocking layer 170 at various incident angles.

The second reflective metal layer 183 may be formed by e-beam evaporation, vacuum deposition, sputtering, metal organic chemical vapor deposition (MOCVD), and the like.

The barrier metal layer 185 may be disposed on a lower surface of the second reflective metal layer 183. The barrier metal layer 185 may be separated from the first reflective metal layer 181 and the current blocking layer 170 by the second reflective metal layer 183. When the barrier metal layer 185 adjoins the current blocking layer 170, light having passed through the current blocking layer 170 may be absorbed by the barrier metal layer 185. However, the second reflective metal layer 183 having higher reflectance than the barrier metal layer 185 is interposed between the current blocking layer 170 and the barrier metal layer 185, and thus, light loss due to absorption by the barrier metal layer 185 may be prevented.

The barrier metal layer 185 prevents Ag in the first reflective metal layer 181 from being diffused outside the first reflective metal layer 181. The barrier metal layer 185 may be formed of Ni, Cr, Ti, Pt, Au, or a combination thereof. For example, the barrier metal layer 185 may have a stack structure having Ni layers and Ti layers repeatedly stacked one above another. Since the barrier metal layer 185, particularly, the Ni layer, has high absorptivity with respect to light emitted from the active layer 113, it may be necessary to prevent light emitted from the active layer 113 from entering the Ni layer. Thus, according to an exemplary embodiment, the second reflective metal layer 183 is disposed between the current blocking layer 170 and the barrier metal layer 185, and is disposed to adjoin the p-type compound semiconductor layer 115, so as to prevent the Ni layer from directly contacting the p-type compound semiconductor layer 115. The barrier metal layer 185 may be formed by e-beam evaporation, vacuum deposition, sputtering, metal organic chemical vapor deposition (MOCVD), and the like.

Figure 9A:
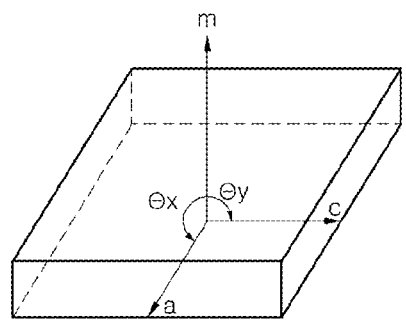
FIG. 9A, FIG. 9B, and FIG. 9C show a perspective view and graphs depicting light beam distributions of the light emitting device according to an exemplary embodiment.
Figure 9B:
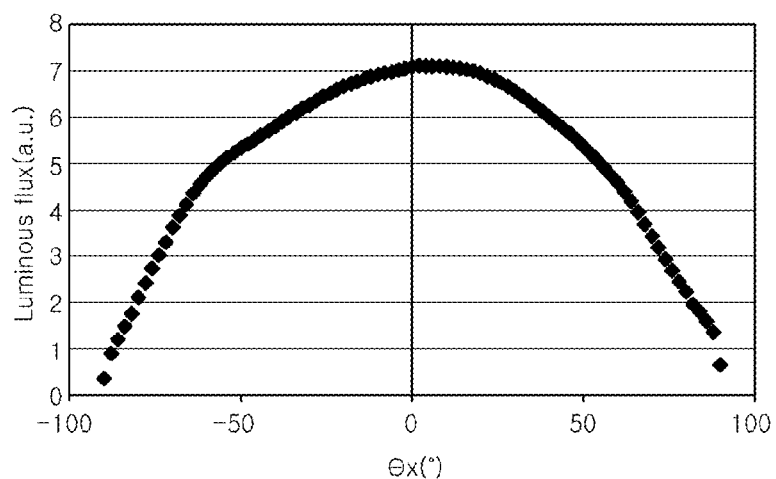
Figure 9C:
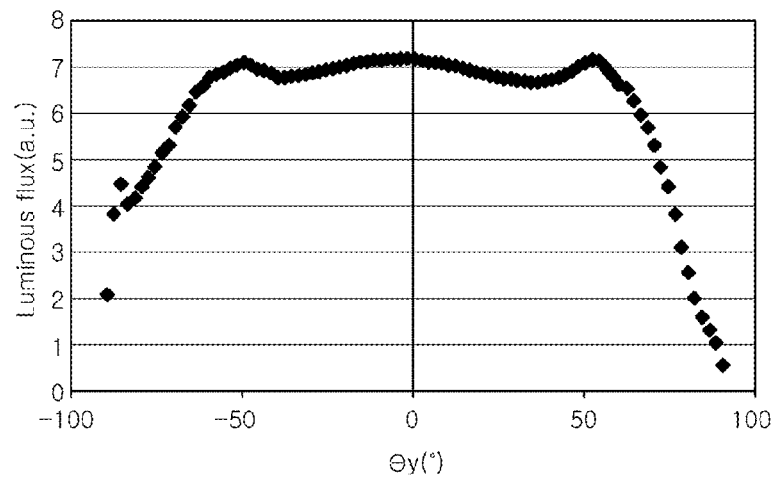

FIG. 9 shows a perspective view, and FIGS. 9B and 9C show graphs depicting light beam distributions of the light emitting device according to an exemplary embodiment.

Referring to FIG. 9A, since an upper surface of the light emitting device according to the exemplary embodiment is close to the m-plane, the upper surface will be represented by the m-plane. Side surfaces of the light emitting device are perpendicular to the m-plane, and correspond to the a-plane and the c-plane. Since the side surfaces of the light emitting device include the a-plane and the c-plane, and include a polar side surface and a non-polar side surface, there is a difference in light beam distribution depending upon direction.

In FIG. 9A, light beam distribution according to the beam angle was measured under conditions that an axis direction perpendicular to the m-plane is represented by an m-axis, an axis direction perpendicular to the a-plane is represented by an a-axis, an axis direction perpendicular to the c-plane is represented by a c-axis, a beam angle in the a-axis direction from the m-axis is represented by θx, and a beam angle in the c-axis direction from the m-axis is represented by θy. FIG. 9B and FIG. 9C are graphs depicting light beam distributions at θx and θy, respectively.

Referring to FIG. 9B, the light beam distribution in the a-axis direction gradually decreases with increasing beam angle with reference to the m-axis, and generally corresponds to the Lambertian distribution. On the other hand, referring to FIG. 9C, it can be seen that the light beam distribution is not substantially reduced until the beam angle θy exceeds 50° and increases at a beam angle of slightly greater than 50°.

Such a light beam distribution may have been obtained since the luminous flux of light emitted through the c-plane is higher than the luminous flux of light emitted through the a-plane.

Herein, although the m-plane is defined as a light exit plane, it is contemplated that the light emitting device exhibits the same light beam distribution on the (−) m-plane, which is an opposite plane to the m-plane.

Such a difference in light beam distribution between θx and θy may utilized in particular applications. For example, the light emitting device according to an exemplary embodiment may be advantageously used in applications that require light emission in one axis direction. Alternatively, the light emitting device according to an exemplary embodiment may be advantageously used in applications that require uniform light emission in a radial direction from the light emitting device. To this end, there is a need for improvement in light beam distribution of the light emitting device.

Figure 10A:
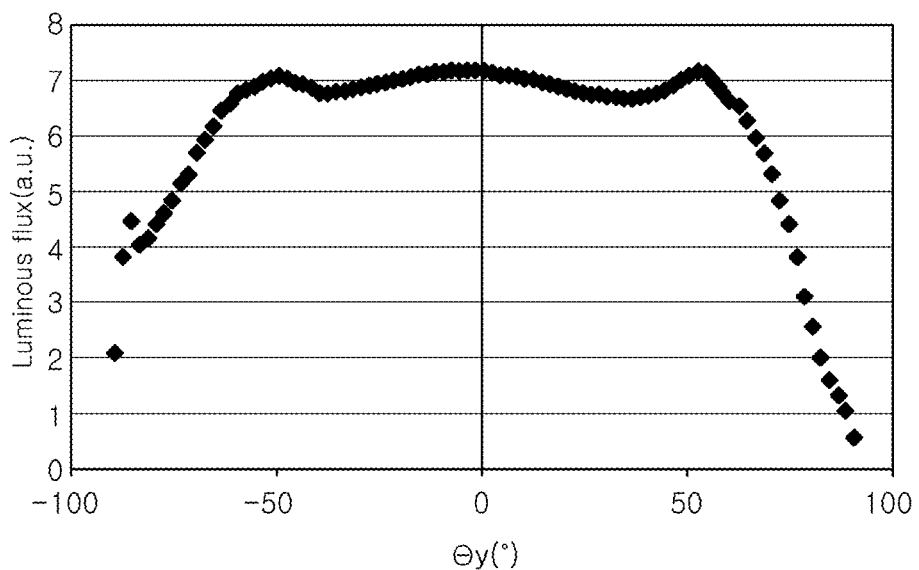
FIG. 10A and FIG. 10B show graphs depicting light beam distributions of the light emitting device according to an exemplary embodiment, after surface machining of the c-plane.
Figure 10B:
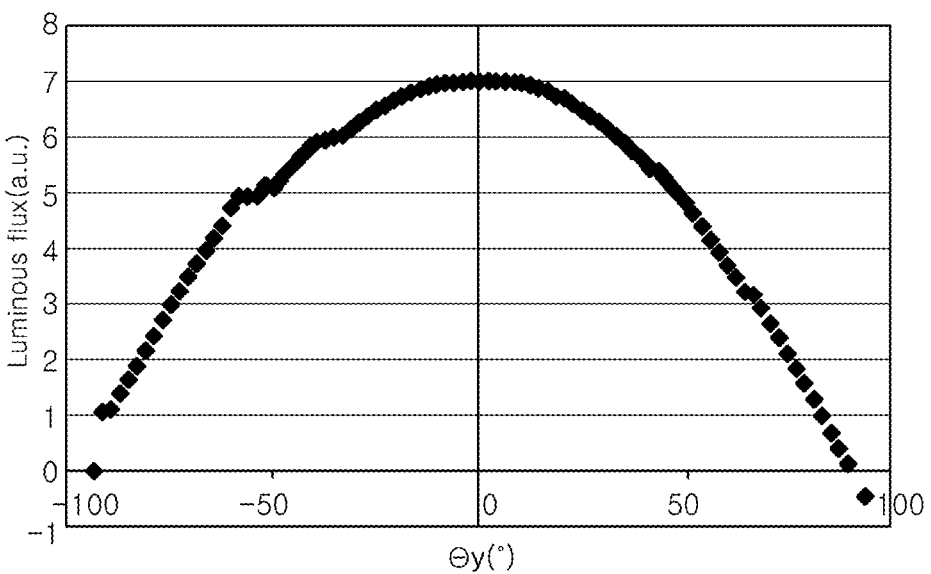

FIGS. 10A and 10B show graphs depicting light beam distributions of the light emitting device according to an exemplary embodiment after surface machining of the c-plane.

The light emitting device may be divided into individual chips by using a stealth laser with respect to the c-plane, to form a surface texture on the side surface of the light emitting device corresponding to the c-plane. Surface machining on the c-plane using the stealth laser may reduce the luminous flux of light emitted through the c-plane. FIG. 10A shows a light beam distribution of the light emitting device, in which both side surfaces of the light emitting device corresponding to the a-plane and the c-plane are subjected to laser scribing and cracking, and is the same as the graph shown in FIG. 9C. FIG. 10B shows a light beam distribution of the light emitting device in the c-axis direction, in which the side surface of the light emitting device corresponding to the a-plane is subjected to laser scribing and cracking, and the side surface of the light emitting device corresponding to the c-plane is subjected to scribing using a stealth laser.

Referring to FIG. 10A and FIG. 10B, it can be seen that the light beam distribution is changed to a light beam distribution similar to the light beam distribution in the a-axis direction through surface machining with respect to the c-plane. Accordingly, the light emitting device having the m-plane as a light exit plane may have a uniform light beam distribution in the radial direction through surface machining of the c-plane.

Figure 11:
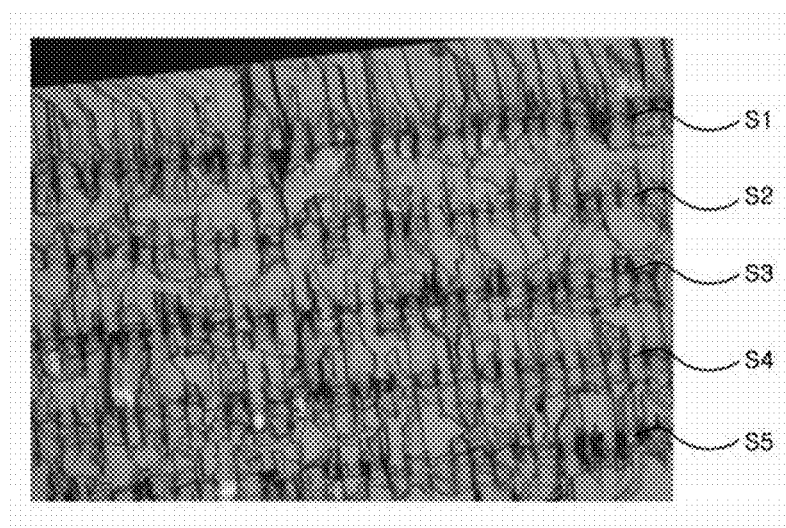
FIG. 11 is an optical image of the c-plane of the light emitting device subjected to surface machining.

FIG. 11 is an optical image of the c-plane of the light emitting device subjected to surface machining. Five stealth laser irradiation lines S1, S2, S3, S4, and S5 are observed on the side surface of the light emitting device corresponding to the c-plane thereof. The number of stealth laser irradiation lines and the distance therebetween may be adjusted in various ways. Various surface morphologies may be formed on the c-plane through stealth laser irradiation and may be used in control of the light beam distribution in the c-axis direction.

A GaN substrate 100 may be irradiated with stealth laser beams, such that a surface texture may be formed on a side surface of the GaN substrate 100 by the stealth laser beams. It is contemplated that, however, other implementations may be formed thereon, for example, the surface texture may be formed on side surfaces of the semiconductor layers 110 and 200.

Figure 12:
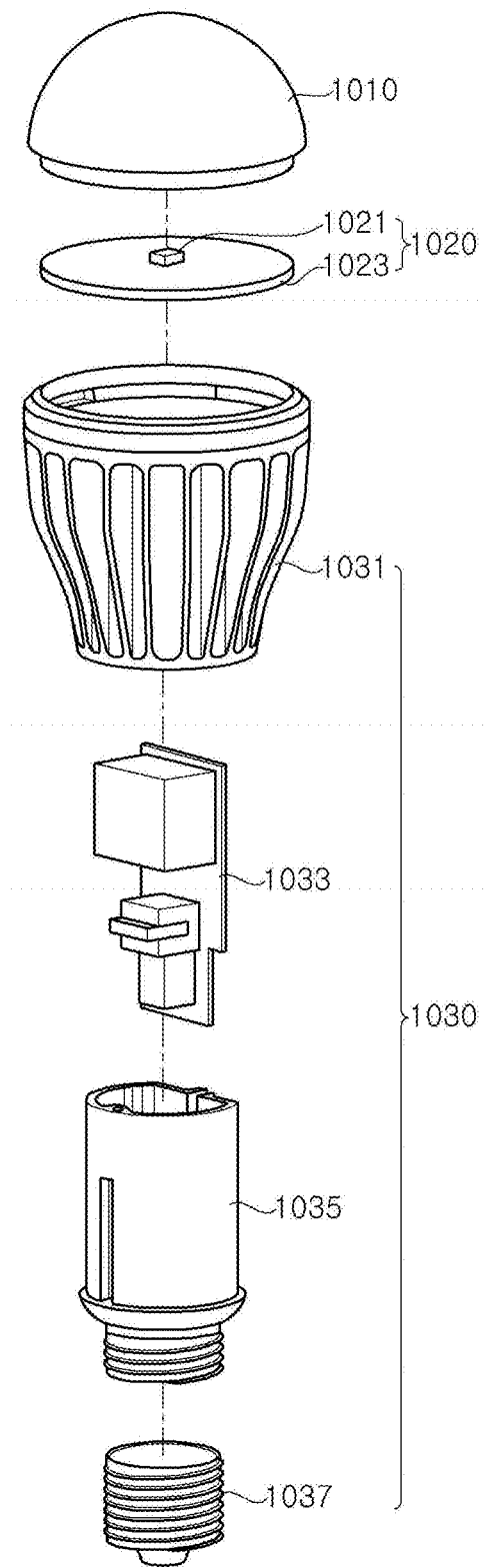
FIG. 12 is an exploded perspective view of a lighting apparatus according to an exemplary embodiment.

FIG. 12 is an exploded perspective view of a lighting apparatus according to an exemplary embodiment.

Referring to FIG. 12, the lighting apparatus according to an exemplary embodiment includes a diffusive cover 1010, a light emitting device module 1020, and a body 1030. The body 1030 may receive the light emitting device module 1020, and the diffusive cover 1010 may be disposed on the body 1030 to cover an upper side of the light emitting device module 1020.

The body 1030 may have any shape, so long as the body 1030 may supply electric power to the light emitting device module 1020, while receiving and supporting the light emitting device module 1020. For example, as shown in FIG. 12, the body 1030 may include a body case 1031, a power supply 1033, a power supply case 1035, and a power source connection portion 1037.

The power supply 1033 is received in the power supply case 1035 to be electrically connected to the light emitting device module 1020, and may include at least one IC chip. The IC chip may regulate, change, or control electric power supplied to the light emitting device module 1020. The power supply case 1035 may receive and support the power supply 1033. The power supply case 1035 having the power supply 1033 secured therein may be disposed within the body case 1031. The power source connection portion 1037 is disposed at a lower end of the power supply case 1035 and coupled thereto. Accordingly, the power source connection portion 1037 is electrically connected to the power supply 1033 within the power supply case 1035, and may serve as a passage through which power may be supplied from an external power source to the power supply 1033.

The light emitting device module 1020 includes a substrate 1023 and a light emitting device 1021 disposed on the substrate 1023. The light emitting device module 1020 may be disposed at an upper portion of the body case 1031 and electrically connected to the power supply 1033.

As the substrate 1023, any substrate capable of supporting the light emitting device 1021 may be used without limitation. For example, the substrate 1023 may include a printed circuit board having interconnects formed thereon. The substrate 1023 may have a shape corresponding to a securing portion formed at the upper portion of the body case 1031, so as to be stably secured to the body case 1031. The light emitting device 1021 may include at least one of the light emitting devices according to exemplary embodiments described above.

The diffusive cover 1010 is disposed on the light emitting device 1021 and may be secured to the body case 1031 to cover the light emitting device 1021. The diffusive cover 1010 may be formed of a light-transmitting material. Light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 13:
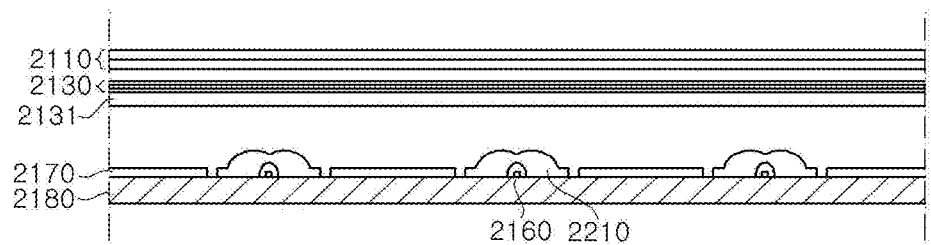
FIG. 13 is a sectional view of a display according to an exemplary embodiment.

FIG. 13 is a sectional view of an exemplary embodiment of a display to which a light emitting device according to an exemplary embodiments is applied.

The display according to the exemplary embodiment includes a display panel 2110, a backlight unit supplying light to the display panel 2110, and a panel guide (not shown) supporting the display panel 2110 along a lower edge of the display panel.

The display panel 2110 is not particularly limited and may be, for example, a liquid crystal panel including a liquid crystal layer. Gate drive PCBs (not shown) may be further disposed at the edge of the display panel 2110 and supply driving signals to a gate line. Here, the gate drive PCBs (not shown) may be formed on a thin film transistor substrate instead of being formed on separate PCBs.

The backlight unit includes a light source module, which includes at least one substrate and a plurality of light emitting devices 2160. The backlight unit may further include a bottom cover 2180, a reflective sheet 2170, a diffusion plate 2131, and optical sheets 2130.

The bottom cover 2180 may be open at an upper side thereof to receive the substrate, the light emitting devices 2160, the reflective sheet 2170, the diffusion plate 2131, and the optical sheets 2130. The bottom cover 2180 may be coupled to the panel guide 2100. The substrate may be disposed under the reflective sheet 2170 to be surrounded by the reflective sheet 2170. Alternatively, when a reflective material is coated onto a surface thereof, the substrate may be disposed on the reflective sheet 2170. Further, a plurality of substrates may be arranged parallel to each other. However, it should be understood that other implementations are also possible and the light source module may include a single substrate.

The light emitting devices 2160 includes at least one of the light emitting devices according to exemplary embodiments described above. The light emitting devices 2160 may be regularly arranged in a predetermined pattern on the substrate. In addition, a lens 2210 may be disposed on each of the light emitting devices 2160 to improve uniformity of light emitted from the plurality of light emitting devices 2160.

The diffusion plate 2131 and the optical sheets 2130 are disposed on the light emitting devices 2160. Light emitted from the light emitting devices 2160 may be supplied in the form of sheet light to the display panel 2110 through the diffusion plate 2131 and the optical sheets 2130.

In this way, the light emitting devices according to exemplary embodiments may be applied to direct type displays like the display according to an exemplary embodiment.

Figure 14:
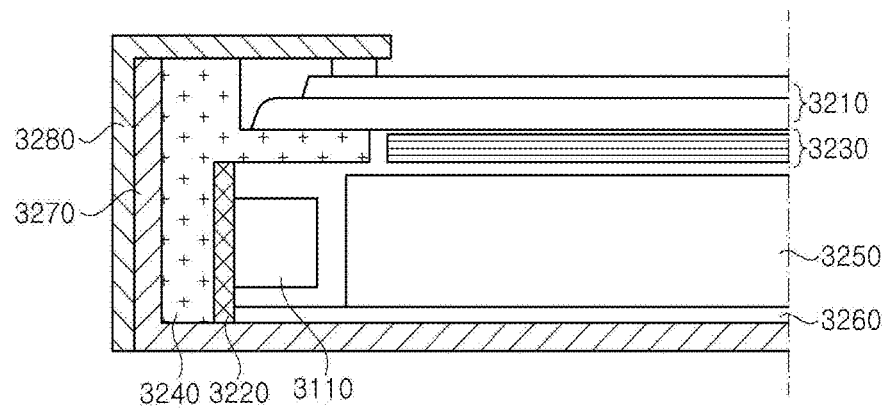
FIG. 14 is a sectional view of a display according to an exemplary embodiment.

FIG. 14 is a sectional view of an exemplary embodiment of a display to which a light emitting device according to exemplary embodiments is applied.

The display according to exemplary embodiment includes a display panel 3210 on which an image is displayed, and a backlight unit disposed at a rear side of the display panel 3210 and emitting light thereto. Further, the display includes a frame supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate drive PCB may be further disposed at an edge of the display panel 3210 and supply driving signals to a gate line. Here, the gate drive PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. The backlight unit according to an exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting devices 3110 arranged at constant intervals on one surface of the substrate 3220. As the substrate 3220, any substrate capable of supporting the light emitting devices 3110 and being electrically connected thereto may be used without limitation. For example, the substrate 3220 may include a printed circuit board. The light emitting devices 3110 may include at least one of the light emitting devices according to exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting device 3110 into sheet light.

In this way, the light emitting devices according to exemplary embodiments may be applied to edge type displays like the display according to an exemplary embodiment.

Figure 15:
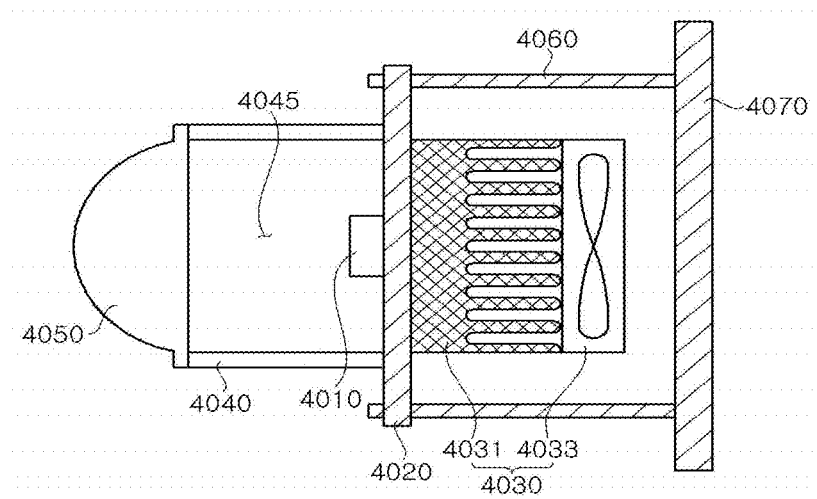
FIG. 15 is a sectional view of a headlight according to an exemplary embodiment.

FIG. 15 is a sectional view of an exemplary embodiment of a headlight to which a light emitting device according to exemplary embodiments is applied.

Referring to FIG. 15, the headlight according to the embodiment includes a lamp body 4070, a substrate 4020, a light emitting device 4010, and a cover lens 4050. The headlight may further include a heat dissipation unit 4030, a support rack 4060, and a connection member 4040.

The substrate 4020 is secured by the support rack 4060, and is disposed above the lamp body 4070. As the substrate 4020, any substrate capable of supporting the light emitting device 4010 may be used without limitation. For example, the substrate 4020 may include a substrate having a conductive pattern, such as a printed circuit board. The light emitting device 4010 is disposed on the substrate 4020 and may be supported and secured by the substrate 4020. In addition, the light emitting device 4010 may be electrically connected to an external power source through the conductive pattern of the substrate 4020. Further, the light emitting device 4010 may include at least one of the light emitting devices according to exemplary embodiments described above.

The cover lens 4050 is disposed on a path of light emitted from the light emitting device 4010. For example, as shown in FIG. 15, the cover lens 4050 may be spaced apart from the light emitting device 4010 by the connection member 4040, and may be disposed in a direction of supplying light emitted from the light emitting device 4010. By the cover lens 4050, a beam angle and/or a color of light emitted from the headlight may be adjusted. On the other hand, the connection member 4040 is disposed to secure the cover lens 4050 to the substrate 4020 while surrounding the light emitting device 4010, so as to act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033, and dissipates heat generated upon operation of the light emitting device 4010.

In this way, the light emitting devices according to exemplary embodiments may be applied to headlights, particularly, headlights for vehicles, like the headlight according to an exemplary embodiment.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting device comprising: a substrate comprising gallium nitride; and a semiconductor layer disposed on the substrate, the semiconductor layer comprising: an n-type nitride semiconductor layer; an active layer disposed on the n-type nitride semiconductor layer; and a p-type nitride semiconductor layer disposed on the active layer, wherein an angle defined between a crystal growth plane of the substrate and an m-plane thereof is in a range of 3.5° to 6°, and
wherein the crystal growth plane of the substrate is at least one of (6 0 −6 1), (7 0 −7 1), and (8 0 −8 1) planes.

2. The light emitting device according to claim 1, wherein an angle defined between a crystal growth plane of the semiconductor layer and the m-plane of the substrate is in a range of 3.5° to 6°.

3. The light emitting device according to claim 1, wherein the active layer comprises:
(Al, Ga, In)N;
a barrier layer having a thickness in a range of 12 nm to 32 nm; and
a well layer having a thickness in a range of 3 nm to 10 nm.

4. The light emitting device according to claim 1, wherein the semiconductor layer further comprises a super lattice layer disposed between the n-type nitride semiconductor layer and the active layer, the super lattice layer comprising indium (In).

5. The light emitting device according to claim 3, wherein:
the semiconductor layer further comprises an electron blocking layer disposed between the p-type nitride semiconductor layer and the active layer; and
the electron blocking layer comprises at least one of $Al_xGa_{(1-x)}N$ (0<x<1) and $Al_xIn_yGa_{(1-x-y)}N$ (0<x<1, 0<y<1, 0<x+y<1).

6. The light emitting device according to claim 5, wherein the electron blocking layer has an energy band-gap greater than that of the barrier layer.

7. The light emitting device according to claim 1, further comprising a first hole injection layer disposed between the active layer and the p-type nitride semiconductor layer.

8. The light emitting device according to claim 7, wherein the first hole injection layer comprises (Al, Ga, In)N and has a dopant concentration in a range of $1E20/cm^3$ to $5E20/cm^3$.

9. The light emitting device according to claim 7, wherein the semiconductor layer further comprises a first undoped layer disposed between the first hole injection layer and the p-type nitride semiconductor layer.

10. The light emitting device according to claim 9, wherein the first undoped layer has a dopant concentration of less than $1E18/cm^3$.

11. The light emitting device according to claim 7, wherein:
the semiconductor layer further comprises an electron blocking layer disposed between the p-type nitride semiconductor layer and the first hole injection layer; and
the electron blocking layer comprises at least one of $Al_xGa_{(1-x)}N$ (0<x<1) and $Al_xIn_yGa_{(1-x-y)}N$ (0<x<1, 0<y<1, 0<x+y<1).

12. The light emitting device according to claim 11, wherein:
the p-type nitride semiconductor layer comprises a second hole injection layer, a p-type contact layer, and a hole transfer layer disposed between the second hole injection layer and the p-type contact layer;
the hole transfer layer comprises a plurality of second undoped layers and at least one intermediate doped layer disposed between the second undoped layers;
each of the second undoped layers comprises a region having a concentration of holes gradually decreasing with increasing distance from the second hole injection layer or the p-type contact layer; and
the intermediate doped layer at least partially overlaps each of the second undoped layers in a region where the concentration of holes reaches 62% to 87% of the concentration of holes of the p-type contact layer.

13. The light emitting device according to claim 12, wherein:
the first and second hole injection layers each has a dopant concentration of $1E20/cm^3$ to $5E20/cm^3$;
the p-type contact layer has a dopant concentration of $4E20/cm^3$ to $1E21/cm^3$;
the intermediate doped layer has a dopant concentration of $1E18/cm^3$ to $1E20/cm^3$; and
the second undoped layers have a dopant concentration of less than $1E18/cm^3$.

14. The light emitting device according to claim 12, wherein a thickness of the hole transfer layer is greater than a total thickness of the second hole injection layer and the p-type contact layer.

15. The light emitting device according to claim 14, wherein:
the intermediate doped layer has a thickness in a range of 2 nm to 10 nm; and
each of the second undoped layers has a thickness in a range of 3 nm to 25 nm.

16. The light emitting device according to claim 12, wherein the second hole injection layer adjoins the electron blocking layer.

17. The light emitting device according to claim 12, wherein the intermediate doped layer has an electrical resistance greater than an electrical resistance of the second undoped layers.

18. The light emitting device according to claim 1, wherein:
the substrate comprises opposite side surfaces in a c-axis direction and opposite side surfaces in an a-axis direction; and
the opposite side surfaces in the c-axis direction comprise surface textures.

19. A light emitting device comprising: an n-type nitride semiconductor layer; an active layer disposed on the n-type nitride semiconductor layer; and a p-type nitride semiconductor layer disposed on the active layer, wherein: the active layer comprises a first plane facing the p-type nitride semiconductor layer; and an angle defined between the first plane and an m-plane of the active layer is in the range of 3.5° to 6°; and
the first plane is at least one of (6 0 −6 1), (7 0 −7 1), and (8 0 −8 1) planes.

20. The light emitting device according to claim 19, wherein the active layer comprises:
(Al, Ga, In)N;
a barrier layer; and
a well layer having a thickness in a range of 3 nm to 10 nm.

21. The light emitting device according to claim 20, wherein the barrier layer has a thickness in a range of 12 nm to 32 nm.

22. The light emitting device according to claim 20, further comprising a first hole injection layer disposed between the active layer and the p-type nitride semiconductor layer.

23. The light emitting device according to claim 22, wherein the first hole injection layer comprises (Al, Ga, In)N and has a dopant concentration in a range of $1E20/cm^3$ to $5E20/cm^3$.

24. The light emitting device according to claim 22, further comprising a first undoped layer disposed between the first hole injection layer and the p-type nitride semiconductor layer.

25. The light emitting device according to claim 24, wherein the first undoped layer has a dopant concentration of less than $1E18/cm^3$.

* * * * *